(12) United States Patent
Pelley

(10) Patent No.: US 9,940,996 B1
(45) Date of Patent: Apr. 10, 2018

(54) MEMORY CIRCUIT HAVING INCREASED WRITE MARGIN AND METHOD THEREFOR

(71) Applicant: NXP USA, INC., Austin, TX (US)

(72) Inventor: Perry H. Pelley, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/446,323

(22) Filed: Mar. 1, 2017

(51) Int. Cl.
| G11C 11/419 | (2006.01) |
| G11C 11/417 | (2006.01) |
| G11C 11/418 | (2006.01) |
| G11C 11/412 | (2006.01) |

(52) U.S. Cl.
CPC .......... *G11C 11/419* (2013.01); *G11C 11/412* (2013.01); *G11C 11/417* (2013.01); *G11C 11/418* (2013.01)

(58) Field of Classification Search
CPC ... G11C 11/419; G11C 11/412; G11C 11/417; G11C 11/418
See application file for complete search history.

(56) References Cited

U.S. PATENT DOCUMENTS

| 6,549,453 | B2 | 4/2003 | Wong |
| 6,765,816 | B2 | 7/2004 | Pelley |
| 6,781,870 | B1 * | 8/2004 | Kushida ................ G11C 11/412 365/154 |
| 6,791,864 | B2 | 9/2004 | Houston |
| 7,200,030 | B2 | 4/2007 | Yamaoka et al. |
| 7,292,495 | B1 * | 11/2007 | Kenkare ................ G11C 5/147 365/203 |
| 7,295,487 | B2 | 11/2007 | Ramaraju et al. |
| 7,492,627 | B2 * | 2/2009 | Russell ..................... G11C 8/16 365/154 |
| 7,502,275 | B2 | 3/2009 | Nii et al. |
| 7,542,369 | B2 | 6/2009 | Kenkare et al. |
| 7,616,516 | B2 | 11/2009 | Hirayama et al. |
| 7,701,755 | B2 | 4/2010 | Chen et al. |
| 7,903,483 | B2 | 3/2011 | Russell et al. |
| 8,031,549 | B2 | 10/2011 | Kenkare et al. |

(Continued)

OTHER PUBLICATIONS

Non-final office action dated Aug. 7, 2017 in U.S. Appl. No. 15/446,338.

(Continued)

*Primary Examiner* — Vu Le
*Assistant Examiner* — Sung Cho

(57) ABSTRACT

A memory circuit includes plurality of bit-cells organized in a column, each bit-cell of the plurality is coupled to a first voltage supply terminal and a second voltage supply terminal. A word-line control circuit is coupled to each bit-cell of the plurality by way of a local bit-line. The word-line control circuit is configured to operatively couple the local bit-line with a global bit-line during a read operation. A first voltage generation circuit is coupled to the first voltage supply terminal. The first voltage generation circuit is configured to provide a first reduced voltage at the first voltage supply terminal during a first write operation. A second voltage generation circuit is coupled to the second voltage supply terminal. The second voltage generation circuit is configured to provide a second reduced voltage at the second voltage supply terminal during the first write operation.

20 Claims, 6 Drawing Sheets

(56) References Cited

U.S. PATENT DOCUMENTS

| | | | |
|---|---|---|---|
| 8,120,975 B2* | 2/2012 | Kenkare | G11C 11/419 |
| | | | 365/154 |
| 8,345,470 B2 | 1/2013 | Satomi et al. | |
| 8,995,208 B2 | 3/2015 | Jung et al. | |
| 9,218,872 B1* | 12/2015 | Liaw | G11C 11/412 |
| 2008/0159014 A1* | 7/2008 | Dray | G11C 11/413 |
| | | | 365/189.09 |
| 2009/0059685 A1* | 3/2009 | Houston | G11C 5/14 |
| | | | 365/189.09 |
| 2012/0044779 A1* | 2/2012 | Chuang | G11C 11/412 |
| | | | 365/226 |
| 2014/0003181 A1* | 1/2014 | Wang | G11C 11/413 |
| | | | 365/226 |
| 2014/0204687 A1* | 7/2014 | Sinangil | G11C 29/52 |
| | | | 365/189.11 |
| 2015/0170734 A1* | 6/2015 | Hwang | G11C 11/412 |
| | | | 365/72 |
| 2016/0372180 A1* | 12/2016 | Amara | G11C 11/412 |

OTHER PUBLICATIONS

Notice of Allowance dated Jan. 19, 2018 in U.S. Appl. No. 15/446,338.

Karl, E., "A 0.6 V, 1.5 GHz 84 Mb SRAM in 14 nm FinFET CMOS Technology With Capacitive Charge-Sharing Write Assist Circuitry", IEEE Journal of Solid-State Circuits, vol. 51, No. 1, Jan. 2016.

Keane., J., "5.6Mb/mm 1R1W SRAM Arrays Operating down to 560mV Utilizing Small-Signal Sensing with Charge-Shared Bitline and Asymmetric Sense Amplifier in 14nm FinFET CMOS Technology", IEEE International Solid-State Circuits Conference, 2016.

\* cited by examiner

US 9,940,996 B1

MEMORY CIRCUIT HAVING INCREASED WRITE MARGIN AND METHOD THEREFOR

BACKGROUND

Field

This disclosure relates generally to memory circuits, and more specifically, to a memory circuit having increased write margin.

Related Art

As semiconductor process technology advances, integrated circuit feature sizes (e.g. transistor gate length) continue to decrease. With smaller feature sizes, integrated circuits can be higher performing and operate at lower voltages. Increasingly, newer generations of memories are using a lower supply voltage to reduce power consumption while taking advantage of smaller feature sizes. The lower supply voltage when used to write a memory, however, degrades the performance of memory bit-cells. For example, the lower supply voltage results in a lower write margin for the bit-cells. However, a lower supply voltage can be used for the memory if the bit-cell write margin can be improved. Thus, there is a need for a memory with an increased write margin.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an integrated circuit memory that includes control circuitry to selectively adjust bit-cell supply voltages during write operations. In one embodiment, the control circuitry includes a global write control portion and a local write control portion coupled to bit-cells of a memory array. The global write control portion provides negatively boosted supply voltages to a bit-cell while the local write control portion provides a full rail voltage on a local bit-line coupled to the bit-cell during write operations. By selectively adjusting bit-cell supply voltages while providing a full rail bit-line voltages, write margins can be increased.

Figure 1:
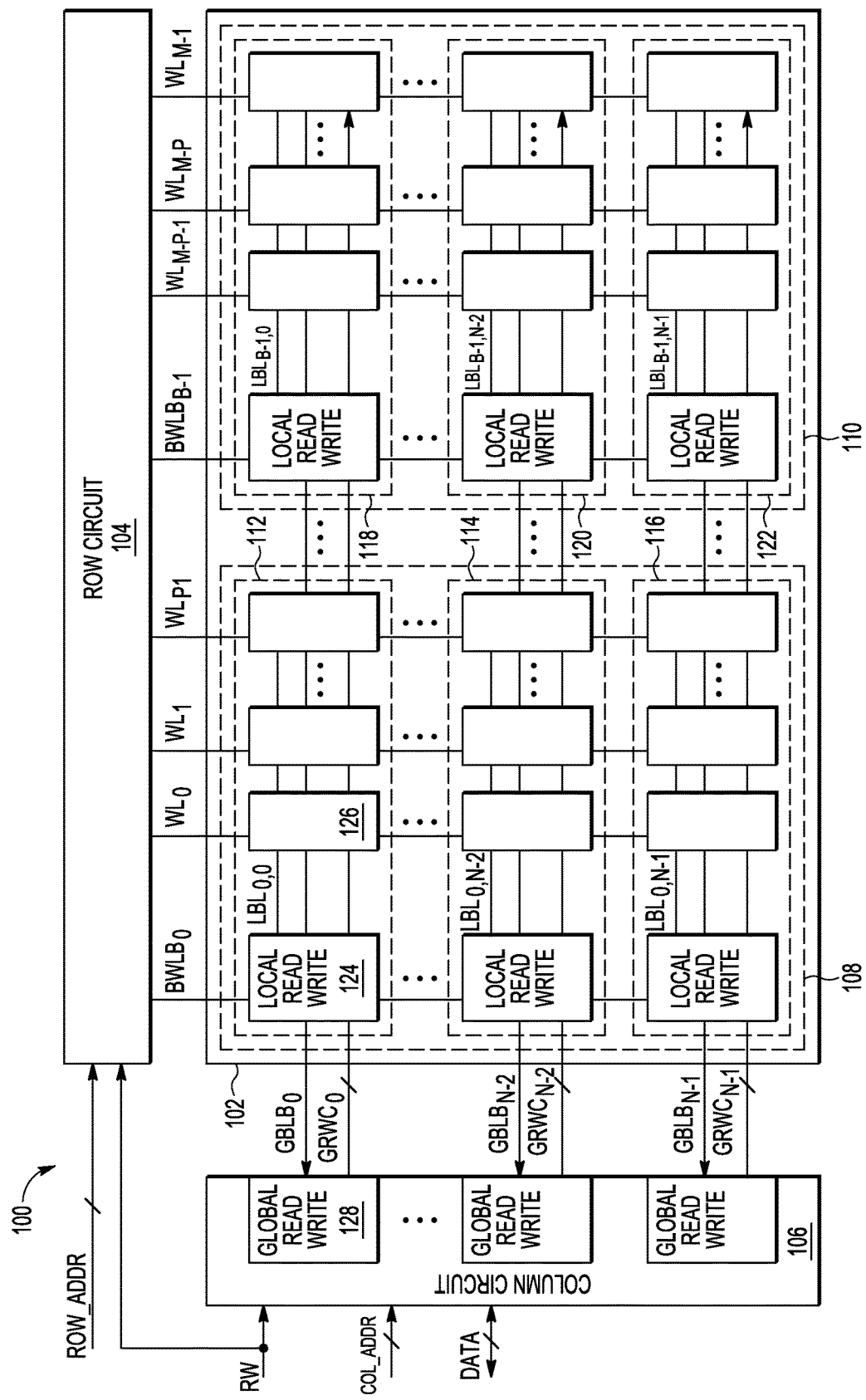
FIG. 1 illustrates, in simplified block diagram form, an exemplary memory circuit in accordance with an embodiment of the present disclosure.

FIG. 1 illustrates, in simplified block diagram form, an exemplary memory circuit 100 in accordance with an embodiment of the present disclosure. Memory circuit 100 may be a portion of a memory. For example, memory circuit 100 may be a portion of a memory coupled to a processor in an integrated circuit characterized as a system-on-a-chip (SoC). Memory circuit 100 may be implemented as a cache memory. Memory circuit 100 may also be implemented as a stand-alone memory, such as static random access memory (SRAM).

Memory circuit 100 includes bit-cell array 102, row circuit block 104, and column circuit block 106. Row circuit 104 and column circuit 106 are used to read and write data from and to bit-cells, such as bit-cell 126 of bit-cell array 102. Row circuit 104 receives row address (ROW_ADDR) signal and read/write (RW) signal from a processor, memory management unit (MMU), direct memory access (DMA) unit, or the like for example. Similarly, column circuit 106 receives column address (COL_ADDR) signal and RW signal from the processor, MMU, DMA, or the like for example. Column circuit 106 provides data and receives data (DATA) to and from the processor, for example. Row circuit 104 and column circuit 106 may include additional signals.

Bit-cell array 102 is organized in M number of word-lines (rows) by N number of columns. Bit-cells of bit-cell array 102 are arranged in B number of blocks (108, 110), where each block includes a plurality of sub-blocks (112-116, 118-122 respectively). Each sub-block includes a local read/write circuit block (124) and P number of bit-cells. For example, local read/write circuit 124 is coupled to bit-cell 126 and other bit-cells of sub-block 112 by way of local bit-line labeled $LBL_{0,0}$, where 0,0 subscript indicates block 0, column 0 respectively.

Row circuit 104 is coupled to provide word-line ($WL_0$-$WL_{M-1}$) and block word-line control ($BWLB_0$-$BWLB_{B-1}$) signals to bit-cell array 102. Word-line ($WL_0$-$WL_{M-1}$) and block word-line control ($BWLB_0$-$BWLB_{B-1}$) signals are used to access bit-cells coupled to a selected word-line.

Column circuit 106 includes a plurality of global read/write control circuit blocks (128). Each global read/write control circuit is coupled to provide a global read/write control signal bus ($GRWC_0$-$GRWC_{N-1}$) to a unique column of bit-cell array 102. $GRWC_0$-$GRWC_{N-1}$ includes signals such as WRITE0, WRITE1B, VDDC, and VSSC. $GRWC_0$-$GRWC_{N-1}$ may also include other signals. Each global read/write control circuit is also coupled to receive data from bit-cell array 102 by way of global bit-line ($GBLB_0$-$GBLB_{N-1}$) signals. For example, global read/write control circuit 128 is coupled to local read/write circuit 124, bit-cell 126, and other local read/write control circuits and bit-cells on the same column by way of $GRWC_0$ and $GBLB_0$ signals.

Figure 2:
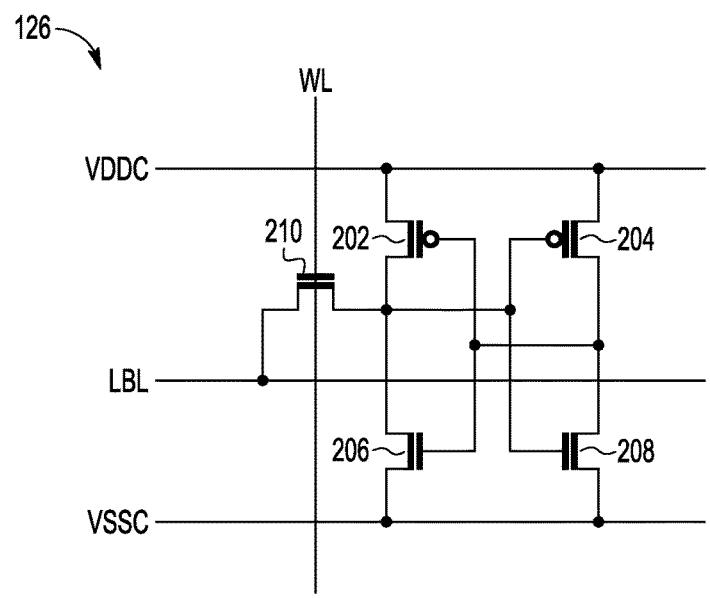
FIG. 2 illustrates, in simplified schematic diagram form, an exemplary memory bit-cell in accordance with an embodiment of the present disclosure.

FIG. 2 illustrates, in simplified schematic diagram form, exemplary memory bit-cell 126 in accordance with an embodiment of the present disclosure. In this embodiment, bit-cell 126 is implemented as a five transistor (5T) cell. Bit-cell 126 includes P-channel pull-up transistors 202 and 204, N-channel pull-down transistors 206 and 208, and N-channel access transistor 210. Transistors 202 and 206 are coupled in series between first and second voltage supply terminals labeled VDDC and VSSC respectively. A first current electrode of transistor 202 is coupled to the VDDC voltage supply terminal, a second current electrode of transistor 202 is coupled to a first current electrode of transistor 206, and a second current electrode of transistor 206 is coupled to the VSSC voltage supply terminal. A control electrode of transistor 202 is coupled to a control electrode of transistor 206. Likewise, transistors 204 and 208 are coupled in series between first and second voltage supply terminals, VDDC and VSSC respectively. A first current electrode of transistor 204 is coupled to the VDDC voltage supply terminal, a second current electrode of transistor 204 is coupled to a first current electrode of transistor 208, and control electrodes of transistors 202 and 206. A second current electrode of transistor 208 is coupled to the VSSC voltage supply terminal. A control electrode of transistor 204 is coupled to a control electrode of transistor 208, the second current electrode of transistor 202, and the first current electrode of transistor 206. Transistors 202-208 are arranged to form a storage element. Access transistor 210 is coupled between the storage element formed by transistors 202-208 and local bit-line labeled LBL. A first current electrode of transistor 210 is coupled to control electrodes of transistors 204 and 208, the second current electrode of transistor 202, and the first current electrode of transistor 206. A second current electrode of transistor 210 is coupled to the local bit-line LBL, and a control electrode of transistor 210 is coupled to word-line signal labeled WL.

Figure 3:
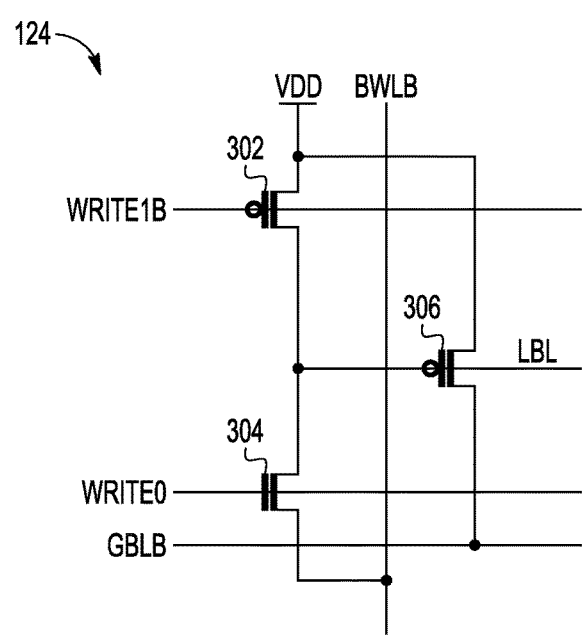
FIG. 3 illustrates, in simplified schematic diagram form, an exemplary block word-line control circuit in accordance with an embodiment of the present disclosure.

FIG. 3 illustrates, in simplified schematic diagram form, an exemplary block word-line control circuit 124 in accordance with an embodiment of the present disclosure. Block word-line control circuit 124 is coupled to receive write control signals such as WRITE0 and WRITE1B from a global read/write control circuit, and a block word-line control signal such as BWLB from row circuit 104.

A first current electrode of P-channel transistor 302 is coupled to voltage supply terminal labeled VDD, a second current electrode of transistor 302 to local bit-line labeled LBL, and a control electrode of transistor 302 is coupled to receive WRITE1B signal. A first current electrode of N-channel transistor 304 is coupled to the LBL local bit-line, a second current electrode of transistor 304 is coupled to receive block word-line control signal BWLB, and a control electrode is coupled to receive WRITE0 signal. A first current electrode of P-channel transistor 306 is coupled to the VDD voltage supply terminal, a second current electrode of transistor 306 to global bit-line labeled GBLB, and a control electrode of transistor 306 is coupled to the LBL local bit-line. In this embodiment, the WRITE1B signal may be used as a pre-charge signal, pre-charging local bit-line LBL to a VDD voltage value by way of transistor 302.

Figure 4:
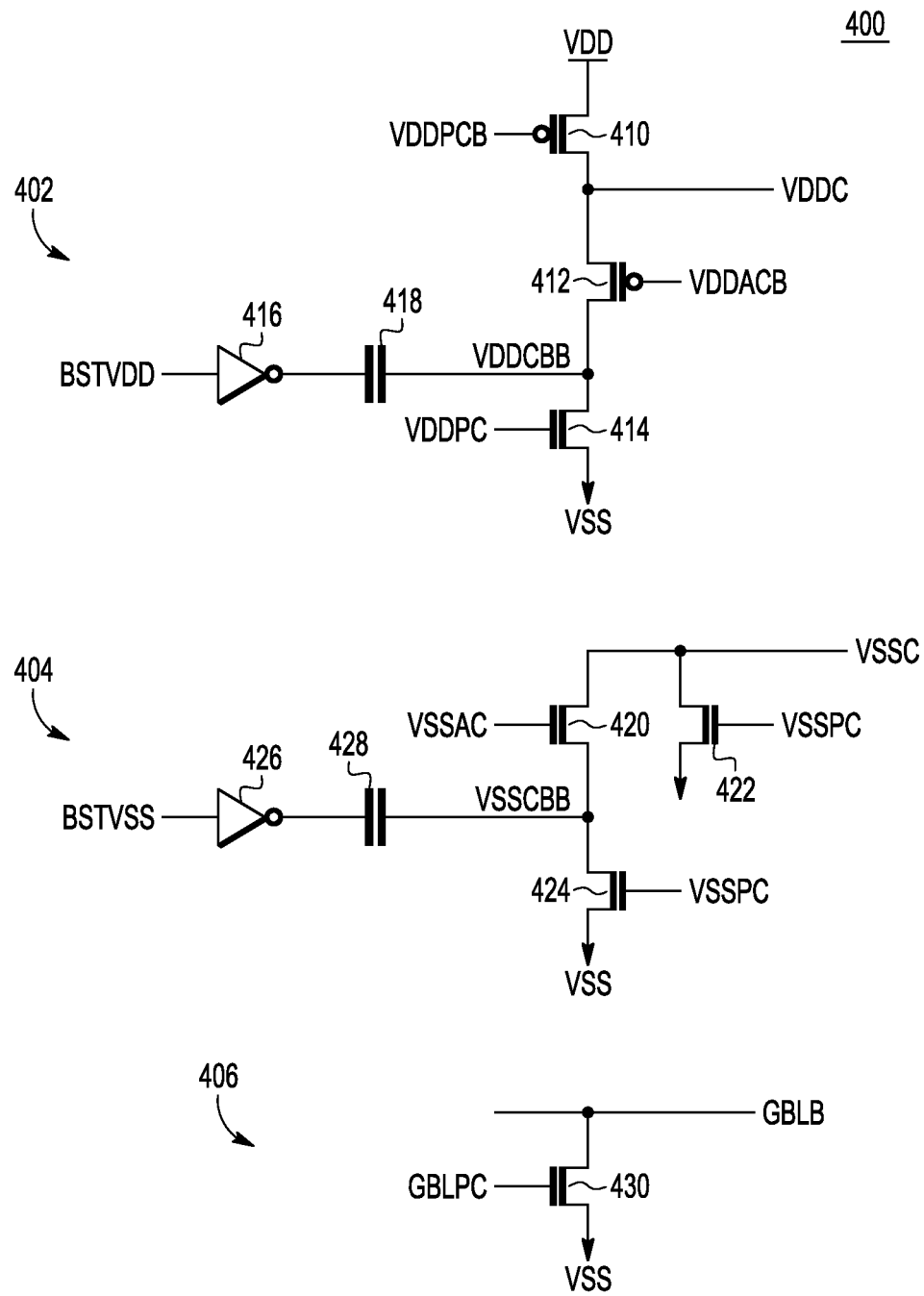
FIG. 4 illustrates, in simplified schematic diagram form, an exemplary portion of global read/write control circuit in accordance with an embodiment of the present disclosure.

FIG. 4 illustrates, in simplified schematic diagram form, an exemplary portion 400 of global read/write control circuit 128 in accordance with an embodiment of the present disclosure. The portion 400 includes a VDDC voltage generation circuit 402, a VSSC voltage generation circuit 404, and a global bit-line pre-charge circuit 406. Generated VDDC and VSSC voltage signals are provided to bit-cells by way of VDDC and VSSC terminals.

VDDC voltage generation circuit 402 includes P-channel transistors 410 and 412, N-channel transistor 414, inverter 416, and capacitor 418. VDDC voltage generation circuit 402 receives a boost signal BSTVDD, a boost access signal VDDACB, a pre-charge signal VDDPC and its complement VDDPCB, and provides an output voltage signal (VDDC) at output labeled VDDC. A first current electrode of transistor 410 is coupled to VDD voltage supply terminal, a second current electrode of transistor 410 is coupled to a first current electrode of transistor 412 and to the VDDC output. A control electrode of transistor 410 is coupled to receive the VDDPCB signal. A second current electrode of transistor 412 is coupled to a first current electrode of transistor 414 and a first terminal of capacitor 418 at node labeled VDD-CBB. A control electrode of transistor 412 is coupled to receive the VDDACB signal. A second current electrode of transistor 414 is coupled to VSS voltage supply terminal and a control electrode of transistor 414 is coupled to receive the VDDPC signal. An input of inverter 416 is coupled to receive the BSTVDD signal and an output of inverter 416 is coupled to a second terminal of capacitor 418.

VSSC voltage generation circuit 404 includes N-channel transistors 420, 422, and 424, inverter 426, and capacitor 428. VSSC voltage generation circuit 404 receives a boost signal BSTVSS, a boost access signal VSSAC, and a pre-charge signal VSSPC, and provides an output voltage signal (VSSC) at output labeled VSSC. A first current electrode of transistor 420 is coupled to the VSSC output and to the first current electrode of transistor 422. A second current electrode of transistor 420 is coupled to a first current electrode of transistor 424 and a first terminal of capacitor 428 at node labeled VSSCBB. A control electrode of transistor 420 is coupled to receive the VSSAC signal. Second current electrodes of transistors 422 and 424 are each coupled to VSS voltage supply terminal and control electrodes of transistors 422 and 424 are each coupled to receive the VSSPC signal. An input of inverter 426 is coupled to receive the BSTVSS signal and an output of inverter 426 is coupled to a second terminal of capacitor 428.

Global bit-line pre-charge circuit 406 includes N-channel transistor 430. A first current electrode of transistor 430 is coupled to global bit-line labeled GBLB, a second current electrode is coupled to VSS voltage supply terminal, and a control electrode is coupled to receive the GBLPC signal.

In this embodiment, VDD may be characterized as a nominal operating voltage of memory circuit 100 and VSS may be characterized as a ground voltage. For example, memory circuit 100 having a bit-cell array implemented as 5T bit-cells and fabricated in an exemplary process technology node may have a nominal operating voltage (VDD) at 1.0 volts.

Figure 5:
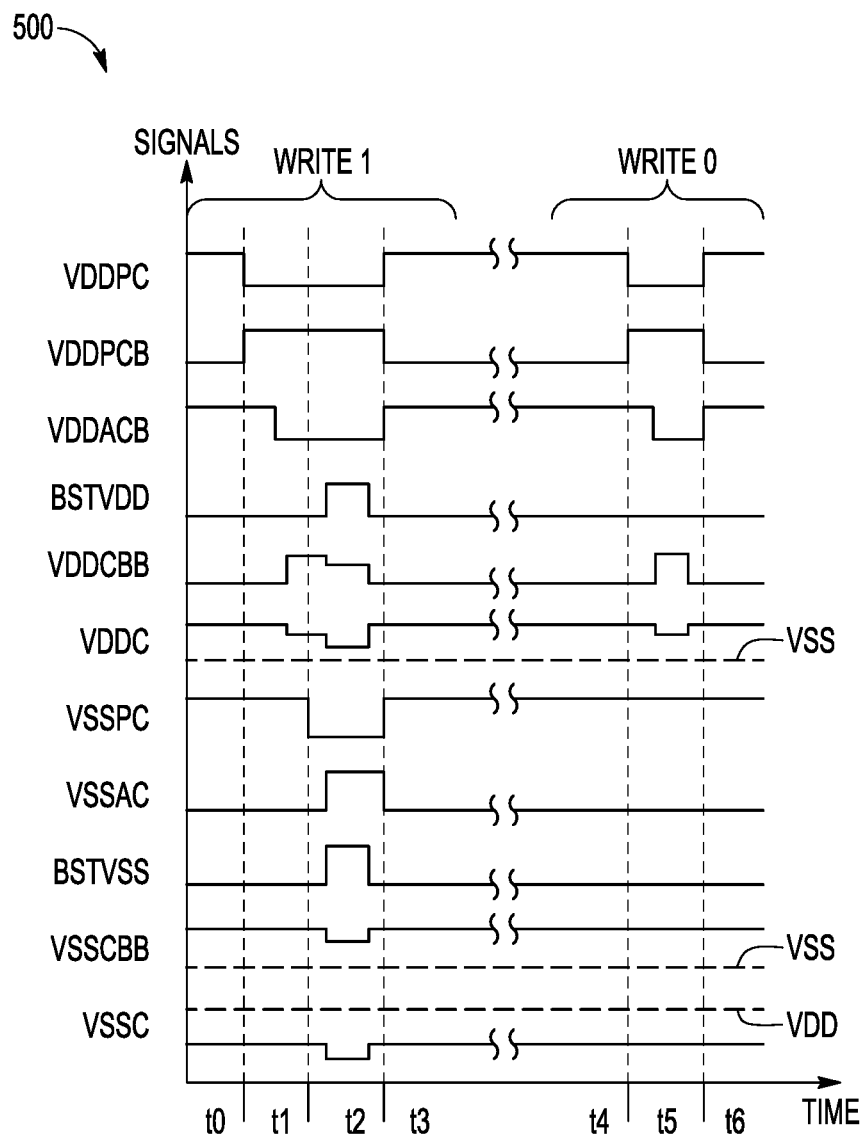
FIG. 5 illustrates, in timing diagram form, exemplary VDDC and VSSC voltage generation circuit control signal timing for write operation in accordance with an embodiment of the present disclosure.

FIG. 5 illustrates, in timing diagram form, exemplary VDDC and VSSC voltage generation circuit control signal timing for write operation in accordance with an embodiment of the present disclosure. Timing diagram 500 includes timing waveforms versus time for write 1 and write 0 operations consistent with the exemplary portion of global read/write control circuit 128 illustrated in FIG. 4. By way of example, signal timing for write operations of the exemplary portion 400 of global read/write control circuit 128 follows.

At period t0, VDDC voltage generation circuit 402, VSSC voltage generation circuit 404, and global bit-line pre-charge circuit 406 are in a pre-charge state of a write 1 operation. Pre-charge signals VDDPC, VSSPC, and GBLPC (not shown) are asserted as a logic high level and complement pre-charge signal VDDPCB is asserted as a logic low level. During the pre-charge state, nodes VDDCBB and VSSCBB are pre-charged to a VSS voltage level (ground), initializing the voltage across capacitors 418 and 428 respectively. VDDC and VSSC outputs are pre-charged to VDD and VSS voltages respectively, by way of transistors 410 and 422. Boost signals BSTVDD and BSTVSS are held at a logic high level during the pre-charge state. Active-low access signal VDDACB is held at a logic high level and active-high access signal VSSAC is held at a logic low level during the pre-charge state.

At period t1, VDDPC and GBLPC (not shown) signals transition to a logic low level and VDDPCB signal transitions to a logic high level ending pre-charge of voltage generation circuit 402 and global bit-line GBLB (not shown). After pre-charge of voltage generation circuit 402 has ended, the VDDACB signal is asserted as a logic low level turning on transistor 412, allowing the VDDC output to charge share with node VDDCBB. In turn, the VDDC output voltage level is reduced by a first VDDC reduction amount in a first boost state of the write 1 operation. A dashed line is shown below the VDDC signal waveform as a relative VSS level for reference.

At period t2, the VSSPC signal transitions to a logic low level ending pre-charge of VSSC voltage generation circuit 404. During period t2, the BSTVDD and BSTVSS signals are asserted as a logic high level which, in turn, respectively reduces the VDDC output voltage by a second VDDC reduction amount in a second boost state of the write 1 operation and reduces the VSSC output voltage by a first VSSC reduction amount. While the VDDC output voltage is at a second reduced voltage and the VSSC output voltage is at a first reduced voltage, a logic high level on the local bit-line LBL causes a logic high level (one) to be stored in the storage element of bit-cell 126, for example. In this embodiment, the logic high level on LBL is at a VDD voltage level. Because LBL is at a VDD voltage level while VDDC and VSSC are at reduced voltages, write margin for the write 1 operation is improved.

At period t3, pre-charge signals VDDPC, VSSPC, and GBLPC (not shown) are asserted as a logic high level and complement pre-charge signal VDDPCB is asserted as a logic low level, transitioning VDDC voltage generation circuit 402, VSSC voltage generation circuit 404, and global bit-line pre-charge circuit 406 to a next pre-charge state.

At period t4, VDDC voltage generation circuit 402, VSSC voltage generation circuit 404, and global bit-line pre-charge circuit 406 are in a pre-charge state of a write 0 operation. Pre-charge signals VDDPC, VSSPC, and GBLPC (not shown) are asserted as a logic high level and complement pre-charge signal VDDPCB is asserted as a logic low level. During the pre-charge state, nodes VDDCBB and VSSCBB are pre-charged to a VSS voltage level (ground), initializing the voltage across capacitors 418 and 428 respectively. VDDC and VSSC outputs are pre-charged to VDD and VSS voltages respectively, by way of transistors 410 and 422. Boost signals BSTVDD and BSTVSS are held at a logic high level during the pre-charge state. Active-low access signal VDDACB is held at a logic high level and active-high access signal VSSAC is held at a logic low level during the pre-charge state.

At period t5, VDDPC and GBLPC (not shown) signals transition to a logic low level and VDDPCB signal transitions to a logic high level ending pre-charge of voltage generation circuit 402 and global bit-line GBLB (not shown). After pre-charge of voltage generation circuit 402 has ended, the VDDACB signal is asserted as a logic low level turning on transistor 412, allowing the VDDC output to charge share with node VDDCBB. In turn, the VDDC output voltage level is reduced by a VDDC reduction amount in a boost state of the write 0 operation. A dashed line is shown below the VDDC signal waveform as a relative VSS level for reference.

At period t6, pre-charge signals VDDPC, VSSPC, and GBLPC (not shown) are asserted as a logic high level and complement pre-charge signal VDDPCB is asserted as a logic low level, transitioning VDDC voltage generation circuit 402, VSSC voltage generation circuit 404, and global bit-line pre-charge circuit 406 to a next pre-charge state.

Figure 6:
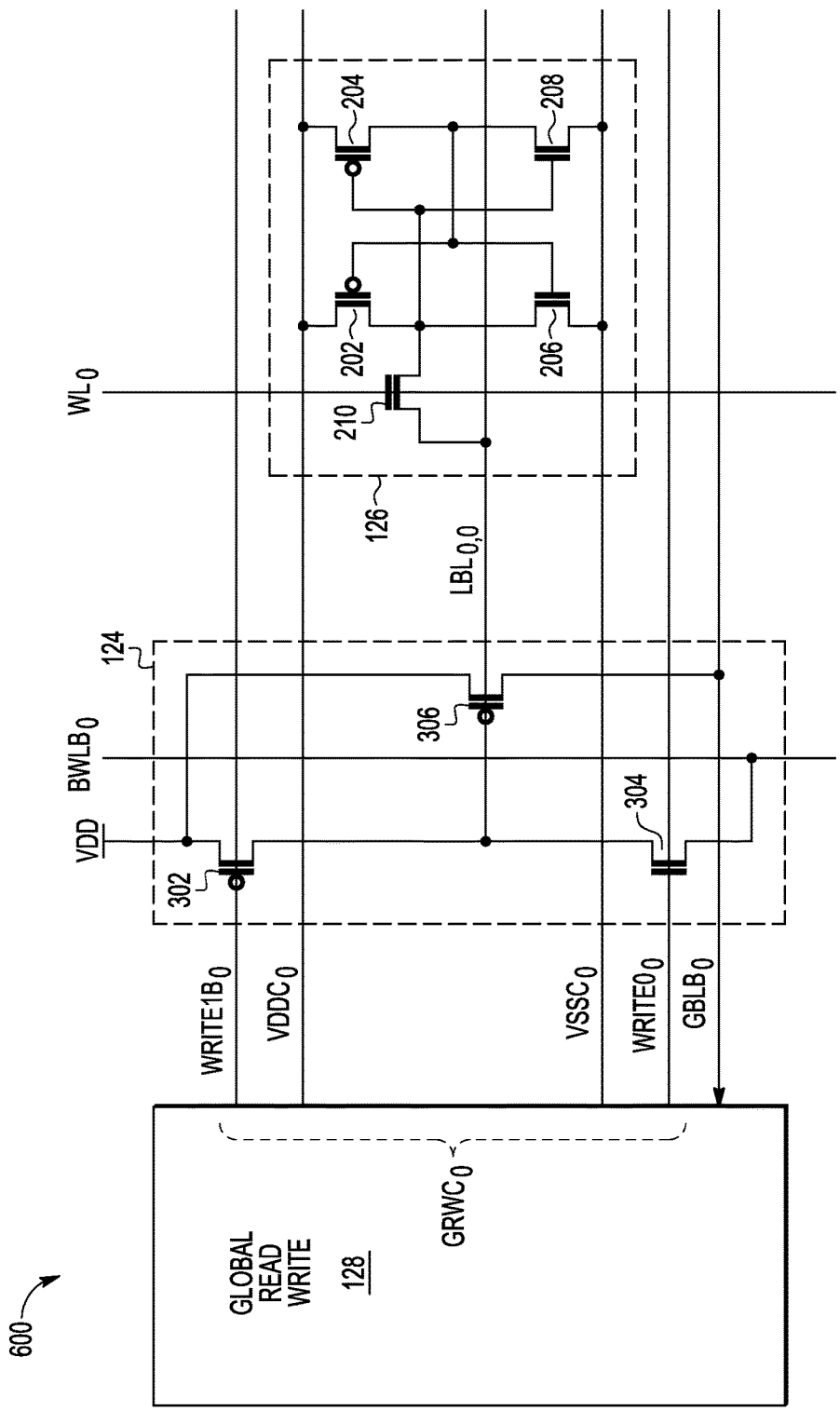
FIG. 6 illustrates, in simplified schematic diagram form, exemplary global read/write control circuitry coupled with exemplary local read/write circuity in accordance with an embodiment of the present disclosure.

FIG. 6 illustrates, in simplified schematic diagram form, exemplary global read/write control circuit 128 coupled with exemplary local read/write circuit 124 and exemplary bit-cell 126 in accordance with an embodiment of the present disclosure. In this embodiment, global read/write control circuit 128 is coupled to provide global read/write control signal $GRWC_0$ to local read/write circuity 124 and bit-cell 126, respectively. $GRWC_0$ includes $WRITE0_0$, $WRITE1B_0$, $VDDC_0$, and $VSSC_0$ signals. $GRWC_0$ may also include other signals. Local read/write circuit 124 is coupled with bit-cell 126 by way of local bit-line $LBL_{0,0}$. The local read/write circuit 124 is also coupled with global read/write control circuit 128 by way of $GBLB_0$. Select transistor 210 is coupled to receive word-line signal WL0 and local read/write circuit 124 is coupled to receive block word-line control signal $BWLB_0$.

Figure 7:
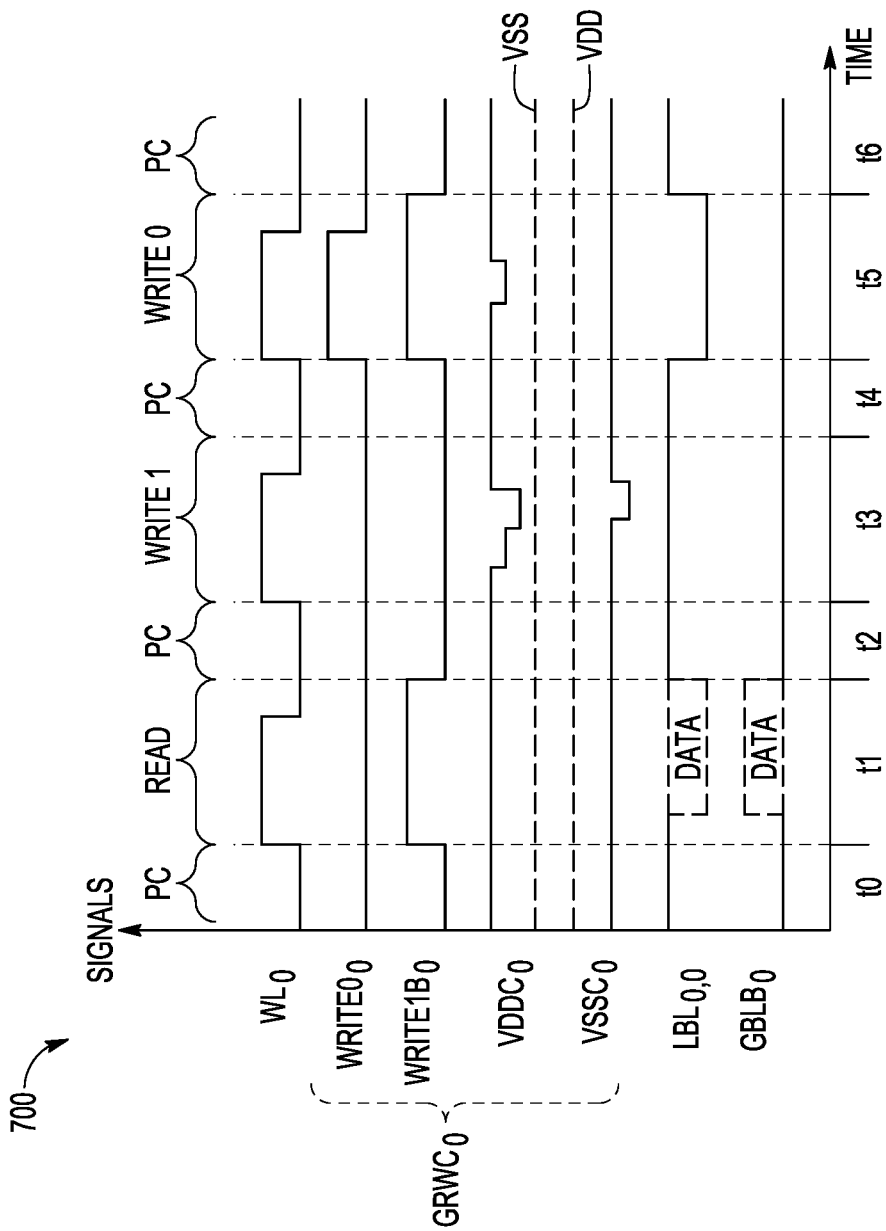
FIG. 7 illustrates, in timing diagram form, exemplary read/write control signal timing in accordance with an embodiment of the present disclosure.

FIG. 7 illustrates, in timing diagram form, exemplary read/write control signal timing in accordance with an embodiment of the present disclosure. Timing diagram 700 includes various timing waveforms versus time for read, write 1, and write 0 operations consistent with the exemplary circuitry illustrated in FIG. 6. By way of example, signal timing for read and write operations of the exemplary circuitry of FIG. 6 follows.

Pre-charge periods such as t0, t2, t4, and t6 occur before read and write operations. At period t0, word-line signal $WL_0$ is de-asserted as a logic low level, inhibiting access to bit-cell 126. Control signals $WRITE0_0$ is de-asserted as a logic low level and $WRITE1B_0$ is asserted as a logic low level to pre-charge local bit-line $LBL_{0,0}$ to a logic high level. $VDDC_0$, and $VSSC_0$ signals are pre-charged to VDD and VSS voltages respectively. Global bit-line signal $GBLB_0$ is pre-charged to a logic low level.

At period t1, block word-line control signal $BWLB_0$ (not shown) is asserted as a logic low level. Word-line signal $WL_0$ transitions to a logic high level, enabling access to bit-cell 126. $WRITE1B_0$ control signal transitions to a logic high level. Because $WRITE0_0$ control signal is at a logic low level and $WRITE1B_0$ control signal is at a logic high level when word-line signal $WL_0$ transitions to a logic high level, a read operation of bit-cell 126 is initiated. A data value (DATA) stored in bit-cell 126 is transferred to local bit-line $LBL_{0,0}$ by way of access transistor 210. The data value (DATA) stored may be a logic high or logic low value. Before the end of the t1 period, the word-line signal $WL_0$ is de-asserted as a logic low level, ending the read operation and inhibiting access to bit-cell 126.

In this embodiment, if the data value stored in bit-cell 126 is a logic high value, DATA value on local bit-line $LBL_{0,0}$ may remain at pre-charged logic high level. Likewise, $GBLB_0$ may remain at pre-charged logic low level. Conversely, if the data stored is a logic low value, DATA value on local bit-line $LBL_{0,0}$ will transition to a logic low level accordingly. Thus, the DATA value on $GBLB_0$ will transition to a logic high level.

At period t2, word-line signal $WL_0$ is de-asserted as a logic low level, control signal $WRITE0_0$ is de-asserted as a logic low level and control signal $WRITE1B_0$ is asserted as a logic low level, pre-charging $LBL_{0,0}$ to a VDD voltage level. $VDDC_0$, and $VSSC_0$ signals are pre-charged to VDD and VSS voltages respectively. Global bit-line signal $GBLB_0$ is pre-charged to a logic low level.

At period t3, block word-line control signal $BWLB_0$ (not shown) is asserted as a logic low level. Word-line signal $WL_0$ transitions to a logic high level, enabling access to bit-cell 126. $WRITE1B_0$ control signal is asserted at a logic low level causing local bit-line $LBL_{0,0}$ to be driven to a VDD voltage level. Because WRITE0$_0$ control signal is at a logic low level and WRITE1B$_0$ control signal is at a logic low level when word-line signal WL$_0$ transitions to a logic high level, a write 1 operation of bit-cell 126 is initiated. During period t3, the VDDC$_0$ output voltage is reduced by a first VDDC reduction amount in a first boost state then reduced by a second VDDC reduction amount in a second boost state of the write 1 operation. The VSSC$_0$ output voltage is reduced by a first VSSC reduction amount concurrently during the second boost state of the write 1 operation. While the VDDC$_0$ output voltage is at a second reduced voltage and the VSSC$_0$ output voltage is at a first reduced voltage, a logic high level on the local bit-line LBL$_{0,0}$ causes a logic high level (one) to be stored in the storage element of bit-cell 126, for example. Because LBL$_{0,0}$ is at a VDD voltage level while VDDC$_0$ and VSSC$_0$ are at reduced voltages, write margin for the write 1 operation is improved. Before the end of the t3 period, the word-line signal WL$_0$ is de-asserted as a logic low level, ending the write 1 operation and inhibiting access to bit-cell 126.

At period t4, word-line signal WL$_0$ is de-asserted as a logic low level, control signal WRITE0$_0$ is de-asserted as a logic low level and control signal WRITE1B$_0$ is asserted as a logic low level, pre-charging LBL$_{0,0}$ to a VDD voltage level. VDDC$_0$, and VSSC$_0$ signals are pre-charged to VDD and VSS voltages respectively. Global bit-line signal GBLB$_0$ is pre-charged to a logic low level.

At period t5, block word-line control signal BWLB$_0$ (not shown) is asserted as a logic low level. Word-line signal WL$_0$ transitions to a logic high level, enabling access to bit-cell 126. WRITE0$_0$ control signal is asserted at a logic high level causing local bit-line LBL$_{0,0}$ to be driven to a VSS voltage level. Because WRITE0$_0$ control signal is at a logic high level and WRITE1B$_0$ control signal is at a logic high level when word-line signal WL$_0$ transitions to a logic high level, a write 0 operation of bit-cell 126 is initiated. During period t5, the VDDC$_0$ output voltage is reduced by a first VDDC reduction amount in a first boost state of the write 0 operation. The VSSC$_0$ output voltage remains at a VSS voltage value. While the VDDC$_0$ output voltage is at a reduced voltage, a logic low level on the local bit-line LBL$_{0,0}$ causes a logic low level (zero) to be stored in the storage element of bit-cell 126, for example. Because LBL$_{0,0}$ is at a VSS voltage level while VDDC0 is at a reduced voltage, write margin for the write 0 operation is improved. Before the end of the t5 period, the word-line signal WL$_0$ is de-asserted as a logic low level, ending the write 0 operation and inhibiting access to bit-cell 126.

At period t6, word-line signal WL$_0$ is de-asserted as a logic low level, control signal WRITE0$_0$ is de-asserted as a logic low level and control signal WRITE1B$_0$ is asserted as a logic low level, pre-charging LBL$_{0,0}$ to a VDD voltage level. VDDC$_0$, and VSSC$_0$ signals are pre-charged to VDD and VSS voltages respectively. Global bit-line signal GBLB$_0$ is pre-charged to a logic low level.

Generally, there is provided, a memory circuit including a first plurality of bit-cells organized in a first column, each bit-cell of the first plurality coupled to a first voltage supply terminal and a second voltage supply terminal; a first word-line control circuit coupled to each bit-cell of the first plurality by way of a first local bit-line, the first word-line control circuit configured to operatively couple the first local bit-line with a first global bit-line during a first read operation; a first voltage generation circuit coupled to a power supply terminal and the first voltage supply terminal, the first voltage generation circuit configured to provide a first reduced voltage at the first voltage supply terminal during a first write operation; and a second voltage generation circuit coupled to the second voltage supply terminal, the second voltage generation circuit configured to provide at the second voltage supply terminal a second reduced voltage during the first write operation and a ground voltage during a second write operation. The memory circuit may further include a second plurality of bit-cells organized in the first column, each bit-cell of the second plurality coupled to the first voltage supply terminal and the second voltage supply terminal; and a second word-line control circuit coupled to each bit-cell of the second plurality by way of a second local bit-line, the second word-line control circuit configured to operatively couple the second local bit-line with the first global bit-line during a second read operation. The bit-cells of the first and second pluralities may be characterized as 5-T memory cells. The first word-line control circuit may include a first transistor having a first current electrode coupled to receive a first word-line control signal, a second current electrode coupled to the first local bit-line, and a control electrode coupled to receive a first global write control signal; a second transistor having a first current electrode coupled to the first local bit-line, a second current electrode coupled to the power supply terminal, and a control electrode coupled to receive a second global write control signal; and a third transistor having a first current electrode coupled to the first global bit-line, a second current electrode coupled to the power supply terminal, and a control electrode coupled to first local bit-line. The first reduced voltage may be lower than a supply voltage at the power supply terminal, and wherein the second reduced voltage may be lower than the ground voltage. The first voltage generation circuit may be configured to pre-charge the first voltage supply terminal to the supply voltage during a pre-charge operation; and the second voltage generation circuit may be configured to pre-charge the second voltage supply terminal to the ground voltage during the pre-charge operation. The first voltage generation circuit may be configured to provide a third reduced voltage at the first voltage supply terminal during the first write operation, the third reduced voltage lower than the first reduced voltage. During the first write operation, the first word-line control circuit may be configured to provide the supply voltage at the first local bit-line while the first voltage supply terminal may be at the third reduced voltage and the second voltage supply terminal may be at the second reduced voltage. The first voltage generation circuit may be configured to provide the first reduced voltage at the first voltage supply terminal during the second write operation. During the second write operation, the first word-line control circuit may be configured to provide a ground voltage at the first local bit-line while the first voltage supply terminal may be at the first reduced voltage and the second voltage supply terminal may be at the ground voltage.

In another embodiment, there is provided, a memory circuit a first plurality of bit-cells, each bit-cell of the first plurality coupled to a first voltage supply terminal and a second voltage supply terminal; a first word-line control circuit coupled to each bit-cell of the first plurality by way of a first local bit-line, the first word-line control circuit configured to operatively couple the first local bit-line with a first global bit-line during a first read operation; and a first global control circuit coupled to the first word-line control circuit and to each bit-cell of the first plurality, the first global control circuit configured to provide during a first write operation a first reduced voltage at the first voltage supply terminal and a second reduced voltage at the second voltage supply terminal. The first global control circuit may be further configured to provide during a second write operation the first reduced voltage at the first voltage supply terminal and a ground voltage at the second voltage supply terminal. The first global control circuit may be further configured to provide a third reduced voltage at the first voltage supply terminal during the first write operation, the third reduced voltage being lower than the first reduced voltage. The memory circuit may further include a second plurality of bit-cells organized in a column with the first plurality of bit-cells, each bit-cell of the second plurality coupled to the first voltage supply terminal and the second voltage supply terminal; and a second word-line control circuit coupled to each bit-cell of the second plurality by way of a second local bit-line, the second word-line control circuit configured to operatively couple the second local bit-line with the first global bit-line during a second read operation. The first word-line control circuit may include a first transistor having a first current electrode coupled to receive a first word-line control signal, a second current electrode coupled to the first local bit-line, and a control electrode coupled to receive a first global write control signal; a second transistor having a first current electrode coupled to the first local bit-line, a second current electrode coupled to a power supply terminal to receive a supply voltage, and a control electrode coupled to receive a second global write control signal; and a third transistor having a first current electrode coupled to the first global bit-line, a second current electrode coupled to the power supply terminal to receive the supply voltage, and a control electrode coupled to first local bit-line. Responsive to the second global write control signal, first global control circuit may provide the supply voltage at the local bit-line during the first write operation. Each bit-cell of the first plurality may include a first transistor having a first current electrode coupled to the first voltage supply terminal; a second transistor having a first current electrode coupled to the first voltage supply terminal, a second current electrode coupled to a control electrode of the first transistor, and a control electrode coupled to a second current electrode of the first transistor; a third transistor having a first current electrode coupled to the second current electrode of the first transistor, a control electrode coupled to the second current electrode of the second transistor, and a second current electrode coupled to the second voltage supply terminal; a fourth transistor having a first current electrode coupled to the second current electrode of the second transistor, a control electrode coupled to the second current electrode of the first transistor, and a second current electrode coupled to the second voltage supply terminal; and a fifth transistor having a first current electrode coupled to the local bit-line, a second current electrode coupled to the second current electrode of the first transistor, and a control electrode coupled to receive a first word-line signal.

In yet another embodiment, there is provided, a method including providing a first bit-cell, the first bit-cell having an access terminal, a first supply terminal, and a second supply terminal; coupling a global control circuit to the first bit-cell, the global control circuit providing a first voltage at the first supply terminal and a second voltage at the second supply terminal; and during a first write operation: reducing the first voltage at the first supply terminal to a first reduced voltage; reducing the second voltage at the second supply terminal to a second reduced voltage; and storing a first data value in the first bit-cell based on a third voltage at an access terminal of the first bit-cell. The third voltage may be greater than the first reduced voltage. The method may further include during a second write operation: reducing the first voltage at the first supply terminal to a third reduced voltage, the third reduced voltage higher than the first reduced voltage; and storing a second data value in the first bit-cell based on a fourth voltage at the access terminal of the first bit-cell, the fourth voltage substantially equal to the second voltage.

By now it should be appreciated that there has been provided, an integrated circuit memory that includes control circuitry to selectively adjust bit-cell supply voltages during write operations. In one embodiment, the control circuitry includes a global write control portion and a local write control portion coupled to bit-cells of a memory array. The global write control portion provides negatively boosted supply voltages to a bit-cell while the local write control portion provides a full rail voltage on a local bit-line coupled to the bit-cell during write operations. By selectively adjusting bit-cell supply voltages while providing a full rail bit-line voltages, write margins can be increased.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name, an asterix (*) following the name, or the letter "B" at the end of the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory circuit, comprising:
   a first plurality of bit-cells organized in a first column, each bit-cell of the first plurality coupled to a first voltage supply terminal and a second voltage supply terminal;
   a first word-line control circuit coupled to each bit-cell of the first plurality by way of a first local bit-line, the first word-line control circuit configured to operatively couple the first local bit-line with a first global bit-line during a first read operation;
   a first voltage generation circuit coupled to a power supply terminal and the first voltage supply terminal, the first voltage generation circuit configured to provide a first reduced voltage at the first voltage supply terminal during a first write operation; and
   a second voltage generation circuit coupled to the second voltage supply terminal, the second voltage generation circuit configured to provide at the second voltage supply terminal a second reduced voltage during the first write operation and a ground voltage during a second write operation.

2. The memory circuit of claim 1, further comprising:
   a second plurality of bit-cells organized in the first column, each bit-cell of the second plurality coupled to the first voltage supply terminal and the second voltage supply terminal; and
   a second word-line control circuit coupled to each bit-cell of the second plurality by way of a second local bit-line, the second word-line control circuit configured to operatively couple the second local bit-line with the first global bit-line during a second read operation.

3. The memory circuit of claim 1, wherein the bit-cells of the first and second pluralities are characterized as 5-T memory cells.

4. The memory circuit of claim 1, wherein the first word-line control circuit includes:
   a first transistor having a first current electrode coupled to receive a first word-line control signal, a second current electrode coupled to the first local bit-line, and a control electrode coupled to receive a first global write control signal;
   a second transistor having a first current electrode coupled to the first local bit-line, a second current electrode coupled to the power supply terminal, and a control electrode coupled to receive a second global write control signal; and
   a third transistor having a first current electrode coupled to the first global bit-line, a second current electrode coupled to the power supply terminal, and a control electrode coupled to first local bit-line.

5. The memory circuit of claim 1, wherein the first reduced voltage is lower than a supply voltage at the power supply terminal, and wherein the second reduced voltage is lower than the ground voltage.

6. The memory circuit of claim 5, wherein:
   the first voltage generation circuit is configured to pre-charge the first voltage supply terminal to the supply voltage during a pre-charge operation; and
   the second voltage generation circuit is configured to pre-charge the second voltage supply terminal to the ground voltage during the pre-charge operation.

7. The memory circuit of claim 5, wherein the first voltage generation circuit is configured to provide a third reduced voltage at the first voltage supply terminal during the first write operation, the third reduced voltage lower than the first reduced voltage.

8. The memory circuit of claim 7, wherein during the first write operation, the first word-line control circuit is configured to provide the supply voltage at the first local bit-line while the first voltage supply terminal is at the third reduced voltage and the second voltage supply terminal is at the second reduced voltage.

9. The memory circuit of claim 1, wherein the first voltage generation circuit is configured to provide the first reduced voltage at the first voltage supply terminal during the second write operation.

10. The memory circuit of claim 1, wherein during the second write operation, the first word-line control circuit is configured to provide a ground voltage at the first local bit-line while the first voltage supply terminal is at the first reduced voltage and the second voltage supply terminal is at the ground voltage.

11. A memory circuit, comprising:
a first plurality of bit-cells, each bit-cell of the first plurality coupled to a first voltage supply terminal and a second voltage supply terminal;
a first word-line control circuit coupled to each bit-cell of the first plurality by way of a first local bit-line, the first word-line control circuit configured to operatively couple the first local bit-line with a first global bit-line during a first read operation; and
a first global control circuit coupled to the first word-line control circuit and to each bit-cell of the first plurality, the first global control circuit configured to provide during a first write operation a first reduced voltage at the first voltage supply terminal and a second reduced voltage at the second voltage supply terminal.

12. The memory circuit of claim 11, wherein the first global control circuit is further configured to provide during a second write operation the first reduced voltage at the first voltage supply terminal and a ground voltage at the second voltage supply terminal.

13. The memory circuit of claim 11, wherein the first global control circuit is further configured to provide a third reduced voltage at the first voltage supply terminal during the first write operation, the third reduced voltage being lower than the first reduced voltage.

14. The memory circuit of claim 11, further comprising:
a second plurality of bit-cells organized in a column with the first plurality of bit-cells, each bit-cell of the second plurality coupled to the first voltage supply terminal and the second voltage supply terminal; and
a second word-line control circuit coupled to each bit-cell of the second plurality by way of a second local bit-line, the second word-line control circuit configured to operatively couple the second local bit-line with the first global bit-line during a second read operation.

15. The memory circuit of claim 11, wherein the first word-line control circuit includes:
a first transistor having a first current electrode coupled to receive a first word-line control signal, a second current electrode coupled to the first local bit-line, and a control electrode coupled to receive a first global write control signal;
a second transistor having a first current electrode coupled to the first local bit-line, a second current electrode coupled to a power supply terminal to receive a supply voltage, and a control electrode coupled to receive a second global write control signal; and
a third transistor having a first current electrode coupled to the first global bit-line, a second current electrode coupled to the power supply terminal to receive the supply voltage, and a control electrode coupled to first local bit-line.

16. The memory circuit of claim 15, wherein responsive to the second global write control signal, first global control circuit provides the supply voltage at the local bit-line during the first write operation.

17. The memory circuit of claim 11, wherein each bit-cell of the first plurality comprises:
a first transistor having a first current electrode coupled to the first voltage supply terminal;
a second transistor having a first current electrode coupled to the first voltage supply terminal, a second current electrode coupled to a control electrode of the first transistor, and a control electrode coupled to a second current electrode of the first transistor;
a third transistor having a first current electrode coupled to the second current electrode of the first transistor, a control electrode coupled to the second current electrode of the second transistor, and a second current electrode coupled to the second voltage supply terminal;
a fourth transistor having a first current electrode coupled to the second current electrode of the second transistor, a control electrode coupled to the second current electrode of the first transistor, and a second current electrode coupled to the second voltage supply terminal; and
a fifth transistor having a first current electrode coupled to the local bit-line, a second current electrode coupled to the second current electrode of the first transistor, and a control electrode coupled to receive a first word-line signal.

18. A method comprising:
providing a first bit-cell, the first bit-cell having an access terminal, a first supply terminal, and a second supply terminal;
coupling a global control circuit to the first bit-cell, the global control circuit providing a first voltage at the first supply terminal and a second voltage at the second supply terminal; and
during a first write operation:
reducing the first voltage at the first supply terminal to a first reduced voltage;
reducing the second voltage at the second supply terminal to a second reduced voltage; and
storing a first data value in the first bit-cell based on a third voltage at an access terminal of the first bit-cell.

19. The method of claim 18, wherein the third voltage is greater than the first reduced voltage.

20. The method of claim 19, further comprising:
during a second write operation:
reducing the first voltage at the first supply terminal to a third reduced voltage, the third reduced voltage higher than the first reduced voltage; and
storing a second data value in the first bit-cell based on a fourth voltage at the access terminal of the first bit-cell, the fourth voltage substantially equal to the second voltage.

* * * * *